United States Patent [19] [11] 4,394,223
Hall [45] Jul. 19, 1983

[54] TIN AND GOLD PLATING PROCESS
[75] Inventor: R. Dean Hall, Baltimore, Md.
[73] Assignee: The United States of America as represented by the Secretary of the Air Force, Washington, D.C.
[21] Appl. No.: 308,973
[22] Filed: Oct. 6, 1981
[51] Int. Cl.³ .......................... C25D 5/02; C25D 5/56
[52] U.S. Cl. .................................. 204/15; 204/32 R; 204/38 S
[58] Field of Search .................. 204/15, 38 S, 32 R, 204/46 G, 54 R, 129.1, 129.65
[56] References Cited
U.S. PATENT DOCUMENTS
2,695,351 11/1954 Beck ............................... 204/15 X
2,959,525 11/1960 Ritt et al. .......................... 204/15
3,470,043 9/1969 Whitfield ........................... 204/15
3,554,876 1/1971 Keene ............................... 204/15

Primary Examiner—T. M. Tufariello
Assistant Examiner—T. Williams
Attorney, Agent, or Firm—Donald J. Singer; Bernard E. Franz

[57] ABSTRACT

A process used for plating a substrate in which the etching of the substrate's copper cladding is terminated early leaving a thin layer of copper. Resist material is then selectively placed upon this thin layer of copper in such a manner that will result in those areas of the circuit to be electroplated being connected. Etching is then resumed to completion, resulting in electrical isolation of those portions of the circuit that are not to be electroplated. Gold electroplating followed by electroless tin plating of the remainder of the circuit can then be performed followed by a final etching to remove the electrical shorts.

5 Claims, 10 Drawing Figures

Fig. 8

TIN AND GOLD PLATING PROCESS

RIGHTS OF THE GOVERNMENT

The invention described herein may be manufactured and used by or for the Government of the United States for all governmental purposes without the payment of any royalty.

BACKGROUND OF THE INVENTION

The field of the present invention is in the art of plating metal onto a substrate and more particularly that of methods employing electroplating and electroless plating techniques.

Electroplating and electroless plating are two widely used methods for plating metal onto a substrate. The choice of which method to employ for a given plating step is as often controlled as much by the choice of the substrate or disadvantages of the respective methods as vis-a-vis the other methods.

Electroplating consists of depositing an adherent metal coating on a substrate for protection purposes. The substrate to be plated is connected to one terminal of a d-c voltage source and placed in an electrolyte. The metal to be deposited is connected to the other terminal and similarly immersed in the electrolyte. The transfer of the metal is accomplished via the ions contained in the current flowing between the electrodes.

Electroless plating involves the use of a plating bath without the imposition of any electric current where the substrate is plated by reduction of the plating metal from a solution of a salt of a plating metal. The plating solution contains controlled reducing agents which are generally either catalyzed by the surface of the substrate, or by some catalytic metal placed onto the surface both to initiate the reduction and to give good adherence. Since the plated-on surface is autocatalytic, an electroless process can be used to build up good thicknesses.

In the field of electronics, microstrip circuitry is increasingly being fabricated on soft dielectric materials clad with copper used as the conductor. This packaging scheme is much cheaper than the use of ceramic substrates with either thick or thin film metallizations. However, with the use of copper as the conductor at least four problems have been encountered. First, the copper including the circuit side edges must be protected to prevent corrosion and oxidation. Second, the conductor surface must remain solderable. Third, some areas of the circuit conductor surface must be able to have components thermocompression bonded to them. Fourth, many areas of the circuit such as long transmission lines or microwave combiners are sensitive to increases in insertion loss.

Electroless tin plating is applied to the copper conductor on many microstrip circuits. Since the plating process is electroless the conductors can be plated after etching, thus the conductor sidewalls are also protected by tin plating. This technique provides a surface readily solderable with lead-tin solders while protecting the copper circuitry from oxidation and corrosion. However, some circuits have areas which must have components thermocompression bonded to them. Tin is not acceptable for this type of bonding. Even more importantly, in some circuits there are areas where insertion loss levels are critical. Tin, because of its lower conductivity than copper, causes an increase in insertion loss when plated on copper circuitry (due to skin effect).

Gold plating seems to be the one material that meets all four requirements of copper protection, solderability, bondability and high conductivity. The electroless gold plating technique would seem to be a logical choice because electrical continuity of the circuit is not needed to accomplish plating. However, electrolessly plated gold films are inferior to electroplated gold films for solderability and bondability. Also, soft dielectric microstrip circuits are built on aluminum carriers used for electrical grounding, mechanical support, and for the mounting of both active and passive components. Because of the high ph (very alkaline) of available electroless gold baths, the aluminum carrier would be rapidly attacked during the plating process.

Gold electroplating baths provide gold films of excellent bondability and solderability. However, all the metal to be plated must be electrically continuous to accomplish the plating operation. Since the plating has to be applied after etching for reasons discussed earlier, the etched circuitry must be electrically shorted together, plated and then unshorted. One method used successfully was to solder wires to the areas of the circuit that needed to be gold plated. These wires were then joined and connected to the gold plating bath cathode to accomplish the electroplating operation. After plating, the wires were removed. Areas that didn't require gold plating were then coated with solder. This technique has been found to be expensive and very time consuming.

Since many circuits are complex with many discontinuous isolated areas such as tuning pads and component mounting pads, it is feasible to gold plate only those areas of the circuit where insertion loss level is critical and where bondability is needed. All remaining areas for which continuity of the circuitry is not needed can be electrolessly tin plated. This invention accomplishes selective electroless tin plating and gold electroplating of etched circuitry while solving the time consumption problem of soldering wires to all areas of the circuit that need gold plating.

SUMMARY OF THE INVENTION

The present invention relates to a process for electroplating gold and electroless plating tin onto the same microstrip substrate clad with copper. This process eliminates the usual steps of soldering wires to all the discontinuous areas of the circuit to be electroplated with gold and then unsoldering the same wires.

An object of this invention is to reduce the expense and time required to fabricate the circuit.

Another object of this invention is to combine the advantages of electroplating gold and electroless tin plating on the same microstrip substrate.

Another object of this invention is to provide a varied level of protection to discrete portions of the circuit that is commensurate with the circuit's needs.

A feature of the invention is that expensive gold plating is only used on those portions of the circuit that require it.

This invention is a method for selectively plating some discontinuous, isolated areas of etched copper microstrip circuitry on a common substrate with gold, and then plating the remaining areas with tin. All of the circuitry to be gold plated is first shorted to a common point, and gold is deposited on this shorted circuitry by electroplating. The areas of the circuitry not shorted to the common point are not affected by the gold plating bath. After gold plating of the shorted areas, the non-shorted areas are tin plated by immersing the entire substrate with the circuitry into an electroless tin plating bath. The gold plated areas are not affected by the tin plating process. The copper shorts which connect the gold plated circuitry are then etched away.

DETAILED DESCRIPTION OF THE INVENTION

FIGS. 1 through 10 show the various steps involved in the plating method. It should be noted that these drawings are not to scale.

Figure 1:
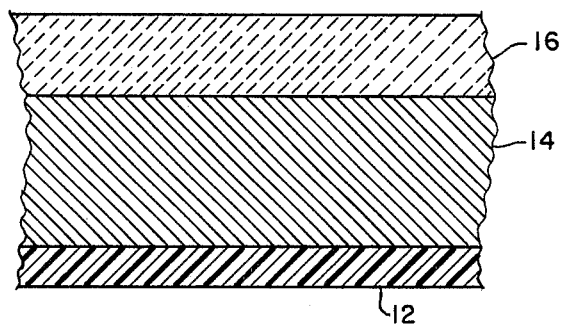
FIG. 1 is a drawing of a cross-sectional view of a circuit card.
Figure 2:
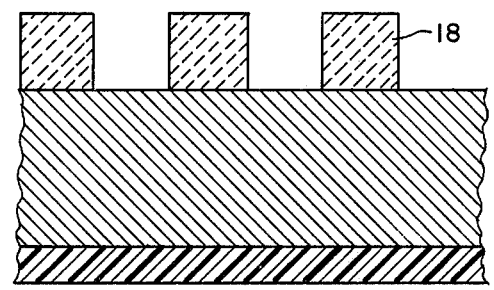
FIG. 2 is a drawing of a circuit card in which photoresist material has defined a circuit pattern.
Figure 3:
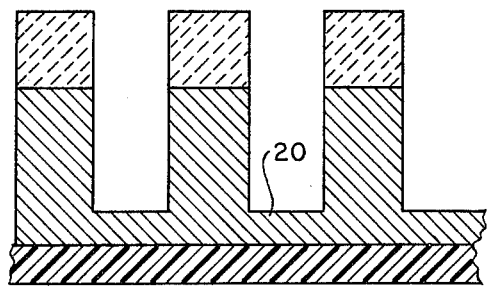
FIG. 3 is a drawing of a circuit card in which the etching process was terminated early.

FIG. 1 shows a cross-sectional view of a circuit card in which a soft dielectric substrate 12 is clad on one side with a layer of copper 14, for example, on the order of 1.4 mils thick. The copper cladding 14 is shown coated with a conventional photosensitive dry film etch resist 16. The circuit pattern is defined in this etch resist by selectively exposing the resist film to ultraviolet light and dissolving away the unexposed resist with the appropriate developing solution. The remaining photoresist 18 defines the desired circuit pattern as shown in FIG. 2. Thus, everywhere the circuitry is, the copper is protected by the etch resist. The remainder of the copper is unprotected and ready to be etched away. However, instead of etching to completion (exposed copper completely removed), the etching time is cut short leaving a very thin layer of copper covering the substrate area except under the etch resist (the circuit pattern). FIG. 3 shows the very thin layer of copper 20 that results from using this shortened etching process. Typically, the original thickness of the copper clad is 1.4 mils (1 oz/ft$^2$) while the thickness when etching is stopped is 0.3 mils±0.1 mil.

Figure 4:
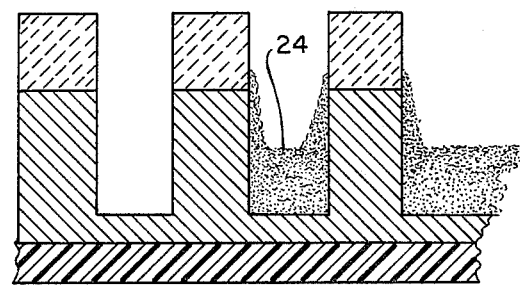
FIG. 4 is a drawing of an etched circuit card in which resist material has been added to protect some copper electrical shorts prior to further etching.

At this point the substrate is rinsed and dried. Next, all of the circuitry to be gold plated is shorted to a common point which, during gold plating, is connected to the cathode of the electroplating apparatus. This is accomplished by hand painting, photoimaging or screen printing resistive material in 5–10 mil wide shorts 24 (as shown in FIG. 4) on the thin layer of copper connecting the thick unetched resist coated portions of the circuitry to be gold plated. These shorts are placed in the most advantageous areas in order to keep their number to a minimum and so that they can be applied quickly and easily.

Figure 5:
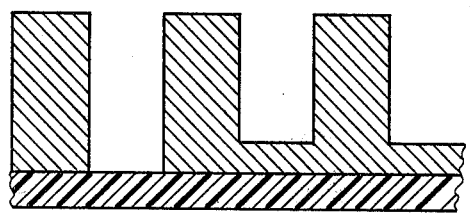
FIG. 5 is a drawing of a circuit card in which part of the copper cladding has been etched to completion while another part is retained with a thin layer; all resist and photoresist material has been removed.

The exposed copper is then etched to completion. The photoresist material is then removed leaving circuitry of full thickness (1.4 mils of copper) shorted electrically together by thin (0.3 mils thick, 5–10 mils width) copper shorts. As shown in FIG. 5, the areas to be tin plated are left electrically isolated.

Figure 6:
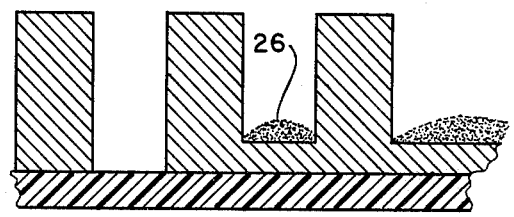
FIG. 6 is a drawing of an etched circuit card in which resistive material has been added to protect those areas not to be gold plated.
Figure 7:
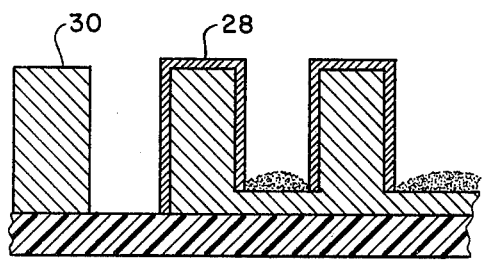
FIG. 7 is a drawing of an etched circuit card in which a portion has been electroplated with gold.

The electrical shorts are then masked with a resistive material 26 either by hand painting, screen painting or photolithography as in FIG. 6. The shorted copper circuitry including sidewalls of the circuit tracks are then electroplated with gold 28, as shown in FIG. 7, usually to a thickness of 50 millionths of an inch. Isolated areas of copper 30 are not affected in the gold plating bath and remain unplated. Following gold plating, the isolated areas are tin plated by immersing the entire substrate in an electroless tin plating bath. As long as the tin plating bath is properly maintained and operated at a temperature of 45°–50° C., the gold plated areas are not affected by the tin plating process. Additional characteristics of plating solutions can be found in any good plater's handbook.

An alternative method of performing the tin plating is to first mask the gold plated areas of the circuit with resist material either by spraying, screen printing, hand painting or photolithography to ensure that no tin adheres to the gold, regardless of the condition of the solution. The entire substrate is then immersed in an electroless tin plating solution to tin plate the remainder of the circuit elements.

Figure 8:
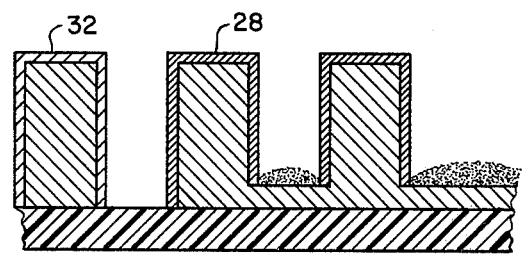
FIG. 8 is a drawing of an etched circuit card which has a portion electroplated with gold and another portion electroless plated with tin.

FIG. 8 depicts the configuration of the circuitry following electroless tin plating in which both tin plating 32 and gold plating 28 adhere to the layer of copper. If the alternative method of tin plating is chosen, the resist material would also adhere to the gold plated areas of FIG. 8 and would subsequently be removed.

Figure 9:
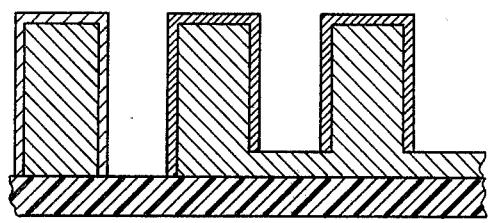
FIG. 9 is a drawing of an etched circuit card, plated with gold and tin, with the resistive material removed.
Figure 10:
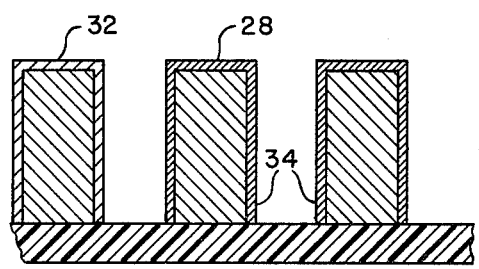
FIG. 10 is a drawing of a circuit card, plated with gold and tin, that has been completely etched.

Following the tin plating, the resistive material 26 of FIG. 6 is removed from the electrical shorts resulting in a circuit configuration as shown in FIG. 9. The thin copper electrical shorts are now exposed while all the circuitry is either tin or gold plated. These unprotected electrical shorts are then etched away by conventional means. The result is a substrate with microstrip circuitry as shown in FIG. 10 in which parts of the circuit are tin plated 32 while other parts are gold plated 28. After this final etching process, sidewalls 34 of the conductors between the areas when the shorts were removed can be tin plated or soldered. The final result will achieve selective plating for the entire microstrip circuit.

Thus, while preferred constructional features of the invention are embodied in the structure illustrated herein, it is to be understood that changes and variations may be made by the skilled in the art without departing from the spirit and scope of the invention.

I claim:

1. A method for plating two metals onto a copper clad substrate comprising the steps of:
   a. defining, by utilizing photoresist material, a circuit pattern on the copper cladding which results in protected copper and unprotected copper;
   b. etching away the unprotected copper until only a thin layer of copper remains;

c. applying resistive material on selected areas of the thin layer of copper in such a manner that first portions of the circuitry to be plated with a first metal are connected to one another via the resistive material while other portions of the circuitry not to be plated with said first metal are not connected via the resistive material to said first portion;

d. etching away to completion the unprotected copper and then removing all photoresist and resistive material;

e. applying resistive material to said selected areas of copper in order to protect them from plating;

f. electroplating said first portions of the circuitry with said first metal;

g. electroless plating said other portions of the circuit with a second metal by immersing the entire substrate in a plating bath; and h. removing all resistive material and then etching away the remainder of the thin copper layer.

2. The method of claim 1, wherein a further step consists of tinning sidewalls of said first portion adjacent to said selected areas where the resistive material was removed.

3. The method of claim 2, wherein said first metal is gold.

4. The method of claim 3, wherein said second metal is tin.

5. The method of claim 1 or 4, wherein a further step between steps (f) and (g) consists of applying resistive material to said first metal in order to protect it from plating by said second metal.

* * * * *